United States Patent
Gardner et al.

(10) Patent No.: US 6,184,578 B1
(45) Date of Patent: Feb. 6, 2001

(54) GRAPHITE COMPOSITE HEAT PIPE

(75) Inventors: William T. Gardner, Los Angeles; Kiho D. Sohn, Woodland Hills, both of CA (US)

(73) Assignee: Hughes Electronics Corporation, El Segundo, CA (US)

(*) Notice: Under 35 U.S.C. 154(b), the term of this patent shall be extended for 0 days.

(21) Appl. No.: 07/486,573

(22) Filed: Feb. 28, 1990

(51) Int. Cl.[7] .............. H01L 23/34; H05K 7/20
(52) U.S. Cl. ............. 257/712; 257/713; 257/728; 361/702; 361/704; 361/709; 361/711; 361/385
(58) Field of Search .............. 357/81, 82; 165/185; 361/385, 704, 707, 709, 713, 702, 711; 257/712, 713, 718, 719, 720, 723, 724, 728, 725

(56) References Cited

U.S. PATENT DOCUMENTS

| | | | |
|---|---|---|---|
| 4,631,636 | * 12/1986 | Andrews | 357/82 |
| 4,724,901 | * 2/1988 | Munekawa | 357/82 |
| 4,867,235 | * 9/1989 | Grapes et al. | 357/81 |
| 4,912,548 | * 3/1990 | Shanker et al. | 357/82 |

* cited by examiner

*Primary Examiner*—Andrew J. James
*Assistant Examiner*—C Whitehead, Jr.
(74) *Attorney, Agent, or Firm*—Terje Gudmestad

(57) ABSTRACT

A heat pipe comprising a wick, working fluid, a chamber housing the wick and working fluid, and a plurality of wraps of a graphite composite fiber, preferably THORNEL graphite fiber, number P-120 2K. For maximum strength, the wraps are in different directions. The heat pipe can be integrally incorporated and bound to a printed wiring board, thereby eliminating the need for additional inefficient thermal interfaces.

20 Claims, 2 Drawing Sheets

THERMAL PERFORMANCE EVALUATION

| HEAT PIPE DESIGN TYPE | WEIGHT (LBS.) | T3 (°C) | T2 (°C) | T1 (°C) |
|---|---|---|---|---|
| ALUMINUM | 0.040 | 42 | 40 | 40 |
| COPPER | 0.120 | 40 | 39 | 39 |
| COMPOSITE | 0.030 | 40 | 39 | 38 |

GRAPHITE COMPOSITE HEAT PIPE

BACKGROUND OF THE INVENTION

1. Field of the Invention

This invention relates to heat pipes for conducting heat away from electronic circuitry and, more particularly, to heat pipes which are particularly well adapted to airborne avionics and to the radar systems used therein.

2. Description of Related Art

As is well known, electronic circuitry often generates heat. For maximum efficiency and longevity, means are often provided to remove or reduce this heat.

Devices called heat pipes have been used for this purpose. Traditionally, heat pipes consist of a wick and fluid housed in a sealed chamber. One end is subjected to heat; the other to a cold wall. The liquid at the heated end boils, the vapor travels to the cold end and condenses, and the capillary action of the wick causes the condensed fluid at the cold end to travel back to the heated end for re-vaporization.

The vapor pressure, unfortunately, is often quite high. For example, the internal working pressure of ammonia at 70 degrees centigrade is approximately 900 pounds per square inch. The chamber, therefore, must be quite strong in order to contain this pressure. Aluminum and copper, for example, typically must have a wall thickness of approximately 0.035 inches. Stainless steel typically must have a wall thickness of approximately 0.023 inches.

These great thicknesses, in turn, add substantial weight to the heat pipe. In many applications, such as airborne avionics, this weight is highly undesirable.

The materials which are typically used for the outer cylinder of the heat pipes, moreover, conduct electricity. As a consequence, interfaces are usually required to electrically isolate the heat pipe from the circuitry. This adds further bulk and weight to the system and reduces heat transfer efficiency.

SUMMARY OF THE INVENTION

It is a principle object of the present invention to obviate these as well as other problems in prior art heat pipes.

It is a further object of the present invention to provide a heat pipe which is light in weight, has great strength and efficiency, is compact, which has a wall thickness of only 0.015 inches, which can remove heat from electronic circuitry without additional electrical isolation in interfaces, and which can be directly integrated in the printed wiring board.

These as well as other objects, features and advantages of the present invention are facilitated by wrapping a thin-walled heat pipe, i.e. one which could not normally withstand the internal pressure, with a composite graphite fiber having high thermal conductivity and tensile strength.

In the preferred embodiment, the composite graphite fiber is THORNEL, a trademark of Union Carbide, model P-120 2K. It is first wrapped longitudinally around the core of the heat pipe at a very low angle, preferably at approximately 15 degrees. Three to four additional layers of it are then tightly wrapped in hoops around the longitudinal wrap.

These two cross-directional wraps give the heat pipe great strength, thereby allowing the inner core to be made of aluminum having a wall thickness of only 0.010 inches. Compared to a traditional aluminum heat pipe, the subject invention has superior thermal conductivity with twenty-five percent less weight.

When utilized with circuit card applications, the subject invention will permit direct integration of the heat sink with the printed wiring board. The result is a single integral assembly of the heat sink and printed wiring board. Additional inefficient and bulky thermal interfaces are therefore eliminated.

These as well as other objects, features and benefits of the present invention will now become apparent from a review of the following description of the preferred embodiments, taken in conjunction with the drawings.

DESCRIPTION OF THE PREFERRED EMBODIMENTS

Figure 1:
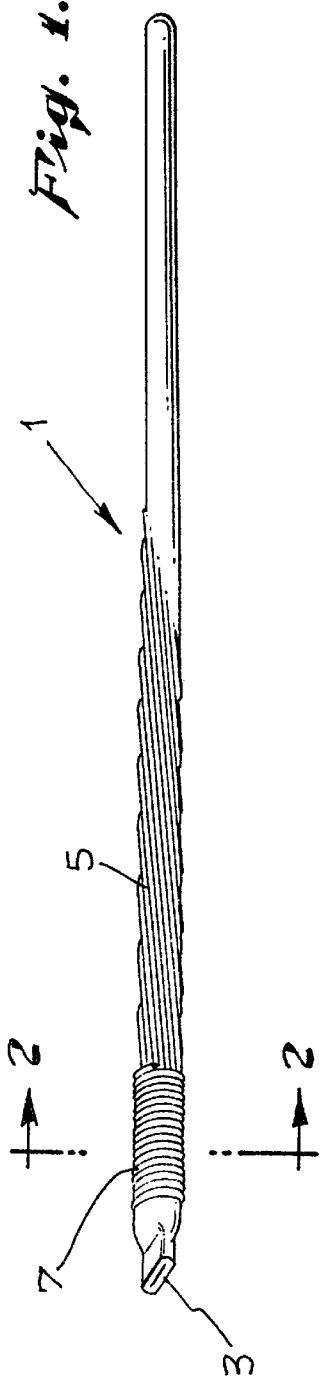
FIG. 1 is a pictorial illustration of a graphite composite heat pipe made in accordance with the present invention with several of the hoop wraps removed so as to expose the underlying longitudinal wraps.

FIG. 1 illustrates a heat pipe made in accordance with the present invention, in which several hoop wraps have been removed so as to expose the longitudinal wraps.

As can be seen in FIG. 1, a heat pipe 1 includes a longitudinal chamber 3 around which are a plurality of longitudinal wraps 5, around which are a plurality of hoop wraps 7. Only a portion of the hoop wraps 7 have been shown so as to visually show the appearance of the longitudinal wraps 5. In practice, the hoop wraps 7 would preferably extend over the entire length of the longitudinal chamber 3.

Figure 2:
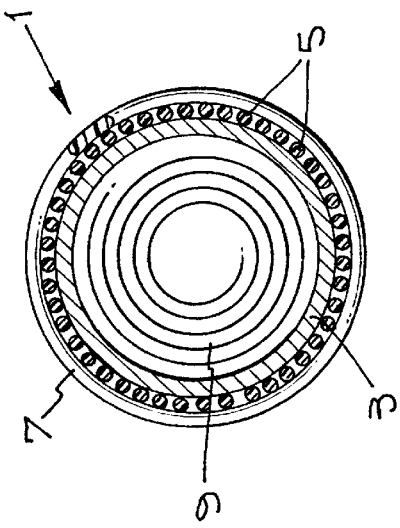
FIG. 2 is a cross section of FIG. 1 taken along the line 2—2.

FIG. 2 is a cross section of the heat pipe 1 shown in FIG. 1 taken along the line 2—2.

As can be seen in FIG. 2, the heat pipe 1 consists of a wick 9, the chamber 3 housing the wick 9 and working fluid (not explicitly shown in FIG. 2), the longitudinal wraps 5, and the hoop wraps 7.

The wick 9 can be any of the types of wicks which are traditionally used in heat pipes. In the preferred embodiment, the wick 9 consists of a two layer, 150 mesh, stainless steel wick.

The working fluid (not shown) which is contained within the chamber 3 can similarly be any of the types of working fluids which are normally used in heat pipes. In the preferred embodiment, acetone is used.

The chamber 3 can similarly be any of the types of chambers which are traditionally used in heat pipes. Because of the outer wrappings 5 and 7, however, the wall thickness of the chamber 3 can be much less than has been needed in the prior art. In the preferred embodiment, the chamber 3 consists of 0.010 inches of 6061T6 aluminum tubing which is hermetically sealed.

The wraps 5 and 7 are made of a graphite composite which has high thermal conductivity and tensile strength. In the preferred embodiment, applicant utilizes a graphite fiber trademarked THORNEL by Union Carbide, number P-120 2K.

To maximize strength, the chamber 3 is first longitudinally wrapped with the graphite fiber, which is shown in FIG. 1 as longitudinal wraps 5. Preferably, the wrap angle is approximately fifteen degrees and the wrap is from 0.030 to 0.040 inches thick.

Over the longitudinal wraps 5 are hoop wraps 7. These are tightly wound wraps of the graphite composite material and, in the preferred embodiment, are from 0.030 to 0.040 inches thick.

For bonding of the wraps 5 and 7 to the chamber 3, a variety of materials can be used. In the preferred embodiment, a matrix of Hexcel Pre-Preg is used. This material conducts heat very well, but does not burn easily.

Figures 3, 4:
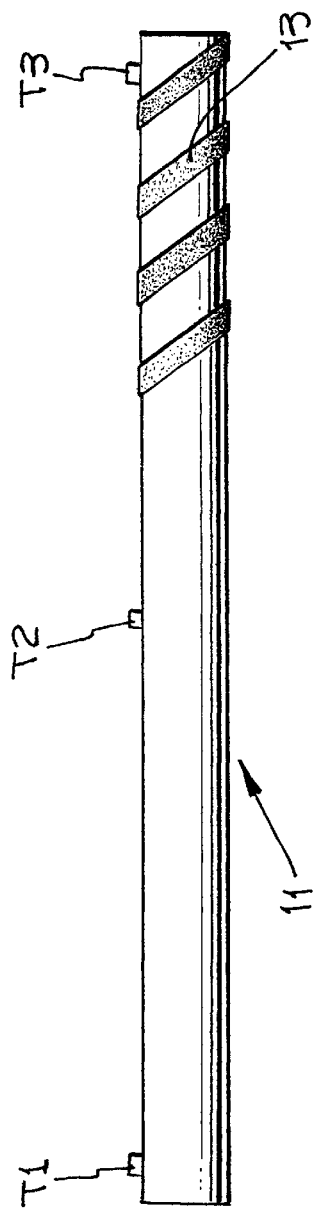
FIG. 3 illustrates a test set up for heat pipes which can advantageously be used to test the performance of heat pipes.
FIG. 4 is a table setting forth test results which were achieved using heat pipes of various design, including a heat pipe made in accordance with the present invention, in the test set up illustrated in FIG. 3.

FIG. 3 illustrates a set up for testing the thermal performance of a heat pipe 11. A heater element 13 is wrapped around one end of the heat pipe 11. Point T1 represents a test point at the cool end of the heat pipe 11. Point T2 represents a test at the approximate middle of the heat pipe 11, while Point T3 represents a test point at the heated end of the heat pipe 11.

FIG. 4 sets forth the data which was taken using the test set up shown in FIG. 3 with two conventional heat pipes, one made of aluminum and the other made of copper, and a graphite composite heat pipe made in accordance with the present invention. The weight of each heat pipe is set forth, together with the steady state temperatures measured at Points T1, T2 and T3 in centigrade.

As can be seen from the table set forth in FIG. 4, a heat pipe made in accordance with the present invention is approximately 25% less in weight, yet yields approximately the same thermal performance.

Figure 5:
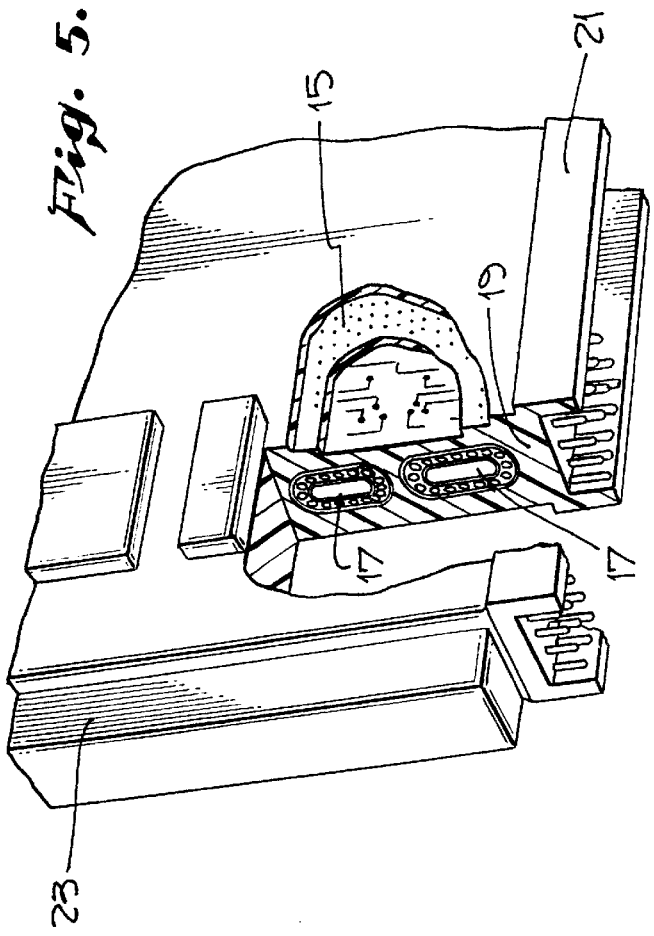
FIG. 5 illustrates a printed wiring board containing integral heat pipes made in accordance with the present invention.

FIG. 5 illustrates a cross section of a printed circuit card containing a plurality of integral heat pipes 17 made in accordance with the present invention.

As shown in FIG. 5, a printed circuit board 15 has integrally bound to it one or more heat pipes 17 using a graphite composite matrix 19. The printed circuit board 15 includes a connector 21 and a cold wall interface 23. If desired, the printed circuit board 15 can be of the multi-level type.

With the structure shown in FIG. 5, heat can be directly removed from the printed circuit board 15 by the heat pipes 17 without the need for additional thermal interfaces. This reduces bulk and weight, and increases thermal efficiency.

Although having now described certain embodiments of the present invention, it is to be understood that the present invention is not limited to these embodiments, but embraces a broad variety of other embodiments and equivalents, as should now be obvious to those skilled in the art. In short, the present invention is limited only by the following claims.

What is claimed is:

1. A heat pipe comprising:
   a. a wick;
   b. working fluid;
   c. a chamber containing said wick and fluid; and
   d. graphite composite fiber having high thermal conductivity and tensile strength wrapped around said chamber.

2. The heat pipe of claim 1 in which said graphite composite fiber is THORNEL graphite fiber, number P-120 2K.

3. The heat pipe of claim 1 wherein said graphite composite fiber is wrapped in two different directions around said chamber.

4. The heat pipe of claim 3 wherein said graphite composite fiber is first wrapped longitudinally around said chamber and then wrapped in hoops around said chamber.

5. The heat pipe of claim 2 wherein said graphite composite fiber is bonded to said chamber with Hexcel Pre-Preg.

6. The heat pipe of claim 3 wherein said wick consists of a two layer mesh of stainless steel, wherein said working fluid is acetone, and wherein said chamber is made of aluminum.

7. The heat pipe of claim 6 wherein said wick is 150 mesh and wherein said chamber has a wall thickness of approximately 0.010 inches and is made of 6061T6 aluminum.

8. The heat pipe of claim 4 wherein said longitudinal wrapping is at approximately a fifteen degree wrap angle.

9. The heat pipe of claim 4 wherein said hoop wrapping consists of approximately three to four layers.

10. An integrally cooled printed wiring board comprising:
    a. a printed wiring board; and
    b. one or more heat pipes, each including a chamber containing a wick and a working fluid, bonded to said printed wiring board with a graphite composite matrix.

11. The printed wiring board of claim 10 wherein said heat pipe includes a graphite composite fiber having high thermal conductivity and tensile strength wrapped around a chamber containing a wick and working fluid.

12. The printed wiring board of claim 11 wherein said graphite composite fiber is THORNEL brand fiber, number P-120 2K.

13. The printed wiring board of claim 10 wherein said wick is 150 mesh stainless steel and wherein said chamber is made of 6061 T6 aluminum and has a wall thickness of approximately 0.010 inches.

14. The printed wiring board of claim 10 wherein said graphite composite fiber is first wrapped lengthwise around said chamber and then wrapped circularly around said chamber.

15. The printed wiring board of claim 14 wherein said lengthwise wrapping is at approximately a 15 degree angle to a longitudinal axis of the heat pipe.

16. The printed wiring board of claim 14 wherein said circular wrapping consists of approximately three to four layers.

17. A thermally conductive pipe for removing heat, comprising:
    a thin walled metal tube having sealed ends;
    a wick disposed within said tube;
    a working fluid disposed within said tube; and
    graphite composite fiber first wrapped lengthwise around said tube and then wrapped circularly around said tube.

18. The thermally conductive pipe of claim 17 wherein said lengthwise wrapping is at approximately a 15 degree angle to a longitudinal axis of said tube and wherein said circular wrapping consists of approximately three to four layers.

19. The thermally conductive pipe of claim 17 wherein said tube is made of 6061 T6 aluminum and has a wall thickness of approximately 0.010 inches, and wherein said graphite composite fiber is THORNEL No. P-120 2K bonded to said tube with HEXCEL PRE-PREG.

20. A thermally conductive pipe for transporting heat, comprising:
    a tube of 6061 T6 aluminum having a wall thickness of approximately 0.010 inches having two ends, each of which are the tube hermetically sealed;
    a working fluid disposed within said tube;
    a wick disposed within said tube; and
    THORNEL No. P-120 2K graphite composite fiber, bonded to said tube with HEXCEL PRE-PREG, first wrapped lengthwise around said tube at approximately a 15 degree angle to a longitudinal axis of the tube and then wrapped circularly along the length of said tube approximately three to four layers thick, wherein both the structural integrity of the tube and the thermal conductivity of the pipe are enhanced by the graphite composite fiber.

* * * * *